(12) United States Patent
Okubo et al.

(10) Patent No.: US 8,967,848 B2
(45) Date of Patent: Mar. 3, 2015

(54) LIGHTING DEVICE

(75) Inventors: Yasushi Okubo, Hino (JP); Takahiko Nojima, Tokyo (JP); Hiroaki Itoh, Hachioji (JP); Ayako Wachi, Hino (JP)

(73) Assignee: Konica Minolta Holdings, Inc. (JP)

( * ) Notice: Subject to any disclaimer, the term of this patent is extended or adjusted under 35 U.S.C. 154(b) by 859 days.

(21) Appl. No.: 13/130,615

(22) PCT Filed: Nov. 16, 2009

(86) PCT No.: PCT/JP2009/069432
§ 371 (c)(1),
(2), (4) Date: May 23, 2011

(87) PCT Pub. No.: WO2010/061747
PCT Pub. Date: Jun. 3, 2010

(65) Prior Publication Data
US 2011/0233566 A1    Sep. 29, 2011

(30) Foreign Application Priority Data

Nov. 27, 2008   (JP) .................... 2008-302201

(51) Int. Cl.
*F21V 7/04*   (2006.01)
*H01L 27/30*   (2006.01)
(Continued)

(52) U.S. Cl.
CPC .............. *H01L 27/305* (2013.01); *B82Y 10/00* (2013.01); *H01L 27/288* (2013.01);
(Continued)

(58) Field of Classification Search
CPC ................. F21Y 2105/00; H01L 2224/48091; H01L 2924/00014; H01L 31/0422; H01L 31/0304; H01L 31/0392; H01L 31/0424; H01L 31/0524; H01L 31/0586; H01L 31/1892; H01L 33/0062; H01L 35/00; G02B 6/0068; G02G 1/133603; F02B 6/0073; F21V 9/16; C09K 11/00
USPC .................................. 362/600–634, 157–208
See application file for complete search history.

(56) References Cited

U.S. PATENT DOCUMENTS

2005/0083323 A1*   4/2005   Suzuki et al. .................. 345/207
2006/0130894 A1*   6/2006   Gui et al. ....................... 136/263
(Continued)

FOREIGN PATENT DOCUMENTS

CN     101156258 A    4/2008
EP       1866986 A   10/2006
(Continued)

OTHER PUBLICATIONS

International Search Report for International Application No. PCT/JP2009/069432 with English translation mailed Feb. 9, 2010.

*Primary Examiner* — William Carter
(74) *Attorney, Agent, or Firm* — Cantor Colburn LLP

(57) ABSTRACT

Provided is a lightweight flexible lighting device with excellent durability and stable performance over repeated use that combines an organic electroluminescent element, an organic photoelectric conversion element, and a secondary cell. The lighting device has a control means for controlling the electrical connections of the organic electroluminescent element, the organic photoelectric conversion element, and the secondary cell. The control means controls the electrical connections such that a reverse bias voltage is applied to the organic electroluminescent element when the organic electroluminescent element receives light, generates power, and charges the secondary cell, and such that a reverse bias voltage is applied to the organic photoelectric conversion element when the organic electroluminescent element is supplied with power from the secondary cell and emits light.

11 Claims, 2 Drawing Sheets

(51) Int. Cl.
   *B82Y 10/00* (2011.01)
   *H01L 27/28* (2006.01)
   *H05B 33/08* (2006.01)
   *H01L 51/00* (2006.01)

(52) U.S. Cl.
   CPC ....... *H05B 33/0896* (2013.01); *H01L 51/0036* (2013.01); *H01L 51/0047* (2013.01); *H01L 51/0085* (2013.01); *H01L 2251/5361* (2013.01)
   USPC .......................... 362/630; 362/611; 362/157

(56) References Cited

U.S. PATENT DOCUMENTS

| | | | |
|---|---|---|---|
| 2006/0226523 A1 | 10/2006 | Foust et al. | |
| 2008/0158137 A1* | 7/2008 | Yoshida | 345/102 |
| 2009/0079345 A1* | 3/2009 | Inuiya | 313/523 |

FOREIGN PATENT DOCUMENTS

| | | |
|---|---|---|
| JP | 3-110786 A | 5/1991 |
| JP | 6-351174 A | 12/1994 |
| JP | 2001-250687 A | 9/2001 |
| JP | 2002-6769 A | 1/2002 |
| JP | 2002-149886 A | 5/2002 |
| JP | 2003-134690 A | 5/2003 |
| JP | 2005-44732 A | 2/2005 |
| JP | 2005-149886 A | 6/2005 |
| JP | 2007-324259 A | 12/2007 |
| JP | 2008-135500 A | 6/2008 |
| JP | 2008-182164 A | 8/2008 |
| JP | 2008535177 A | 8/2008 |
| KR | 20080003792 | 1/2008 |
| WO | 2006/107379 A1 | 10/2006 |
| WO | 2007/141720 A1 | 12/2007 |

* cited by examiner

US 8,967,848 B2

LIGHTING DEVICE

CROSS REFERENCE TO RELATED APPLICATIONS

This application is a U.S. National Phase Application under 35 USC 371 of International Application No. PCT/JP2009/069432 filed on Nov. 16, 2009. Priority under 35 U.S.C. 119(a) and 35 U.S.C. 365(b) is claimed from Japanese Application No. JP 2008-302201, filed Nov. 27, 2008 the disclosure of which is also incorporated herein by reference.

TECHNICAL FIELD

The present invention relates to a lighting device comprising an organic electroluminescence element, an organic photoelectric conversion element, and a secondary cell.

BACKGROUND TECHNOLOGY

A system in combination of a photovoltaic power generation device (a solar cell), a light-emitting member, and a secondary cell can be used as a stand-alone lighting device with no power source. For example, a lighting device in combination of a silicone solar cell, a white LED (a light-emitting member), and a secondary cell has been proposed and commercialized. However, since the above white LED is a point light source, and an electric power generation layer of the above silicone solar cell is made of a crystal, the above lighting device is unable to be provided with flexibility, and thereby, it was not made to be a compact independent lighting device such that it can be stored in a roll form or carried with the device folded.

On the other hand, both an organic electroluminescence element and an organic photoelectric conversion element are an electronic device which is all solid state and in a form of a thin film. Due to the above reasons, it has been expected that, by using the above organic electroluminescence element as the light-emitting member and the above organic photoelectric conversion element as the solar cell, and by combining them with the solar cell, there can be constituted a lighting device which needs no power source and is light, thin, flexible, and portable. It can be assumed that such a lighting device can not only be used for an outdoor leisure use but also contribute to the spread of lighting in developing countries where development of infrastructure such as electricity is delayed.

However, the organic electroluminescence element and organic photoelectric conversion element have a problem of low durability, and there is a need for improvement.

In addition, in the above lighting device in combination of a light-emitting member, a solar cell, and a secondary cell, a constitution and a driving method of the lighting device have so far been disclosed, in which prevention of degradation of the secondary cell was focused.

For example, it has been disclosed that, in response to the degradation of the above secondary cell, in a lighting device constituted of a light-emitting element (a light emitting member), a solar cell, and a secondary cell, an over discharge control circuit detects electric energy stored in the secondary cell, and then, based on the detection signal, controls power supply from the secondary cell (for example, refer to Patent Document 1).

In addition, it has been disclosed that, in the above lighting device, open voltage of the secondary cell is measured, and then, charging is controlled by comparing the measured open voltage with prescribed overcharge protection voltage (for example, refer to Patent Document 2).

However, these lighting devices are constituted of an inorganic LED which is hard to be bent, a crystal silicon solar cell which is likely to break when dropped, a very heavy lead-acid storage battery, and the like, and therefore, the use, in which a light device which is unlikely to break is assumed to be carried around, is not taken into consideration, and further, there are no descriptions on problems in the case where a light and thin light-emitting element (an organic electroluminescence element) suitable for carrying around, photoelectric conversion element (organic photoelectric conversion element), a secondary cell (a lithium-ion battery), and the like are combined.

PRIOR ARTS

Patent Document

Patent Document 1: Japanese Patent Application Publication (hereinafter also referred to as JP-A) No. H6-351174
Patent Document 2: JP-A No. 2003-134690

SUMMARY OF THE INVENTION

Issues to be Solved by the Invention

Patent Document 1 relates to controlling power supply from a secondary cell with an over discharge control circuit, preventing the secondary cell from over-discharge, and aiming to achieve a long-life of the secondary cell.

Patent Document 2 relates to comparing an open voltage of a secondary cell with prescribed overcharge protection voltage to control charging, and thereby preventing overcharge.

However, as described above, in the case of a constitution using the organic electroluminescence element and the organic photoelectric conversion element, which are light and unlikely to break when they are dropped, the above organic electroluminescence element and organic photoelectric conversion element have a problem of low durability.

It is said that one of the degradation factors of the organic electroluminescence element and the organic photoelectric conversion element is penetration of water, oxygen, and the like, but other than that, it is also said that a factor of the degradation is carrier trap at a local site of an element, for example, an interface between a positive hole transport layer and a light emission layer of the organic electroluminescence element. As a circumstantial evidence of the above factor, it is reported that, by applying a reverse bias voltage to the organic photoelectric conversion element, the life thereof is extended (JP-A Nos. H3-110786 and 2007-324259). This is presumed that a carrier, caught in a trap in which the carrier does not flow in a forward direction, is taken out by applying an electric field in the reverse direction, and thereby the degradation originated from the carriers accumulated in the local site is suppressed.

In Patent Documents 1 and 2, no countermeasures against such degradation of the organic electroluminescence element and the organic photoelectric conversion element are taken, and therefore, durability of each element could not be improved in the case where the above organic electroluminescence element and the above organic photoelectric conversion element were used in the lighting device.

The present invention has been achieved in view of the foregoing, and it is an object of the invention to provide a lighting device in combination of an organic electroluminescence element, organic photoelectric conversion element, and a secondary cell, which exhibits an excellent durability and stable properties even if it is repeatedly used.

Measures to Solve the Issues

The above purposes can be achieved by constitutions below.

Item 1. A lighting device, in which an organic photoelectric conversion element, an organic electroluminescence element, and a secondary cell are electrically connected to each other, has a control means which controls the above electrical connection, wherein the above control means controls the above electrical connection so that the above organic photoelectric conversion element receive light to generate electricity, when the above secondary cell is charged, a reverse bias voltage is applied to the above organic electroluminescence element, and, when the above organic electroluminescence element is supplied with electric power from the above secondary cell to emits light, a reverse bias voltage is applied to the above organic photoelectric conversion element.

Item 2. The lighting device described in Item 1, wherein the above reverse bias voltage applied to the above organic electroluminescence element is −0.5 to −30 V.

Item 3. The lighting device described in Items 1 or 2, wherein the above reverse bias voltage applied to the above organic photoelectric conversion element is −0.5 to −30 V.

Item 4. The lighting device described in any one of Items 1 to 3, wherein the above control means switches, at the time of charging the above secondary cell, the connection of the above secondary cell from the above organic photoelectric conversion element to the above organic electroluminescence element when open voltage of the above secondary cell becomes higher than or equal to overcharge protection voltage.

Item 5. The lighting device described in any one of Items 1 to 4, wherein the above control means applies a reverse bias voltage on a temporary basis at every constant time interval to both the above organic photoelectric conversion element at the time of the above charging and the above organic electroluminescence element at the time of the above light emission.

Item 6. The lighting device described in any one of Items 1 to 5, wherein the above organic electroluminescence element is a phosphorescent light emitting device.

Item 7. The lighting device described in any one of Items 1 to 6, wherein both the above organic electroluminescence element and the above organic photoelectric conversion element are formed by a solution process, in which a coating solution, a liquid composite, is applied to a substrate via a coating means to form a coated film layer.

Item 8. The lighting device described in any one of Items 1 to 7, wherein the above organic electroluminescence element, the above organic photoelectric conversion element, and the secondary cell are formed on a flexible board in a sheet shape and are laminated.

Effects of the Invention

Due to the above constitutions, in a lighting device in combination of an organic photoelectric conversion element, an organic electroluminescence element, and a secondary cell, a degradation factor (carriers accumulated in the local site) of the above organic photoelectric conversion element and the above organic electroluminescence element can be effectively taken out when one of the above elements is not used. With this, the degradation of the above organic photoelectric conversion element and the above organic electroluminescence element can be reduced, and thereby durability can be improved.

Furthermore, the secondary cell can be protected from overcharge, and thereby durability of the entire lighting device can be improved.

MODE FOR CARRYING OUT THE INVENTION

The inventors of the present invention made an application of knowledge disclosed in a report (JP-A Nos. H3-110786 and 2007-324259) that the life of the above organic photoelectric conversion element is extended by applying a reverse bias voltage to the element, and then, found means to improve durability of a lighting device comprising an organic electroluminescence element, organic photoelectric conversion element, and a secondary cell.

Namely, it was found that the durability can be significantly improved by allowing the above lighting device to have an electrical connection in such a way that, at a time when one of the organic electroluminescence element and organic photoelectric conversion element works and the other stops working, a reverse bias voltage is applied from a secondary cell to the other element.

Hereinafter, embodiments of the present invention will be described with reference to figures, but the present invention is not limited to them.

Figure 1:
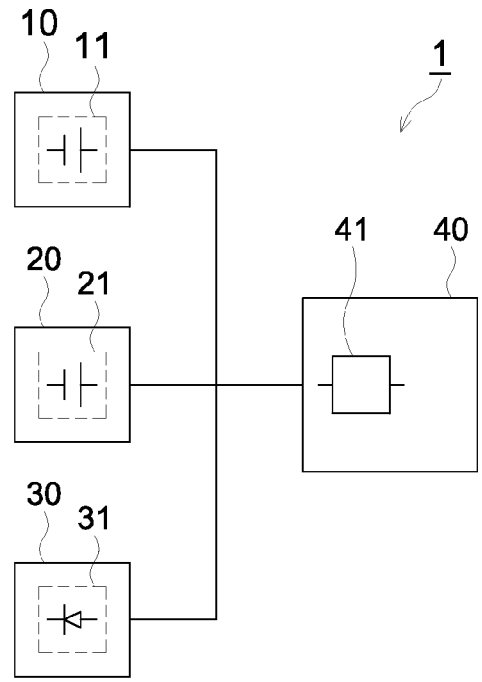
FIG. 1 is a block diagram showing an example of the lighting device relating to the present invention.

FIG. 1 is a block diagram showing an example of the lighting device relating to the present invention.

Lighting device 1 comprises solar cell section 10, secondary cell section 20, light-emitting section 30, and control section 40, all of which are electrically connected to each other.

Solar cell section 10 is provided with organic photoelectric conversion element 11 (Organic Photovoltaic hereinafter, also referred to as an OPV) as a solar cell, and OPV 11 generates direct current electric power by receiving light.

Secondary cell section 20 is provided with secondary cell 21, and is charged by the direct current electric power generated by OPV 11, and at the same time supplies the direct current electric power to light-emitting section 30.

Light-emitting section 30 is provided with organic electroluminescence element 31 (Organic light-emitting diode, hereinafter, also referred to as an OLED or an organic EL element), and OLED 31 emits light when supplied with the direct current electric power.

Control section 40 comprises connection circuit (also referred to as a circuit) 41, electrically connects solar cell section 10, secondary cell section 20, and light-emitting section 30, and, at the same time, controls the above connection.

<<Control of Lighting Device>>

Next, the control of lighting device 1 will be described.

As described above, control section 40 controls OPV 11 of solar cell section 10, secondary cell 21 of secondary cell section 20, and OLED 31 of light-emitting section 30.

Figure 2:
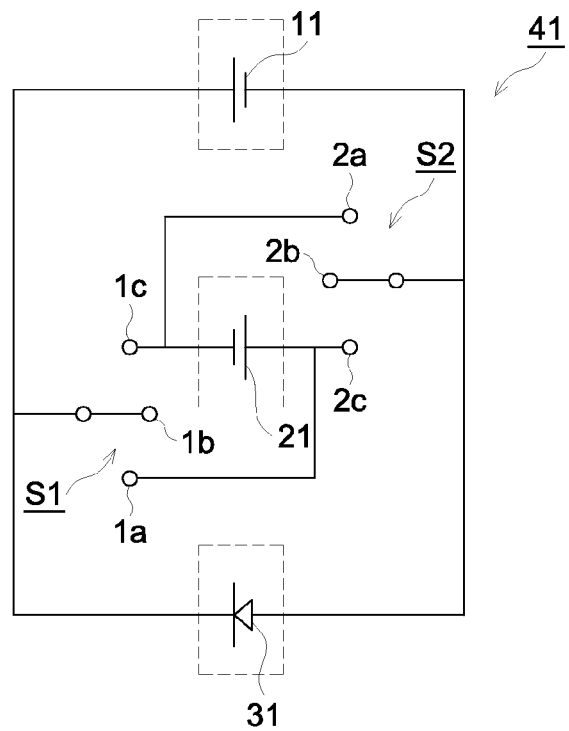
FIG. 2 is a circuit diagram showing connections of an OPV, a secondary cell, an OLED, and a connection circuit.

FIG. 2 is a brief circuit diagram to describe a connection of OPV 11, secondary cell 21, OLED 31, and connection circuit 41. In practice, it is designed so that it further has a function to detect and control voltage of secondary cell 21 or to distribute voltage applied to OLED 31 and OPV 11, or a function to increase the electromotive force from the solar cell.

S1 and S2 in FIG. 2 show a switch. In an example shown in FIG. 2, switches S1 and S2 are so-called single pole triple throw switch, in which switch S1 has two contacts with 1a and 1c and a midpoint 1b, and switch S2 has two contacts with 2a and 2c and a midpoint 2b.

As switches S1 and S2, a commonly known switch can be used as long as it can switch the connection of a circuit (opening and closing). For example, included are a rotary switch, an electromagnetic relay, an electronic switch using a semiconductor, and the like. However, since mechanical switches such as the above rotary switch require a driving means for driving the switch to automatically switch a circuit, the above electromagnetic relay, electronic switch, and the like, which can electrically switch a circuit, are preferred, in view of ease of control.

[At the Time of Charging]

Figure 3:
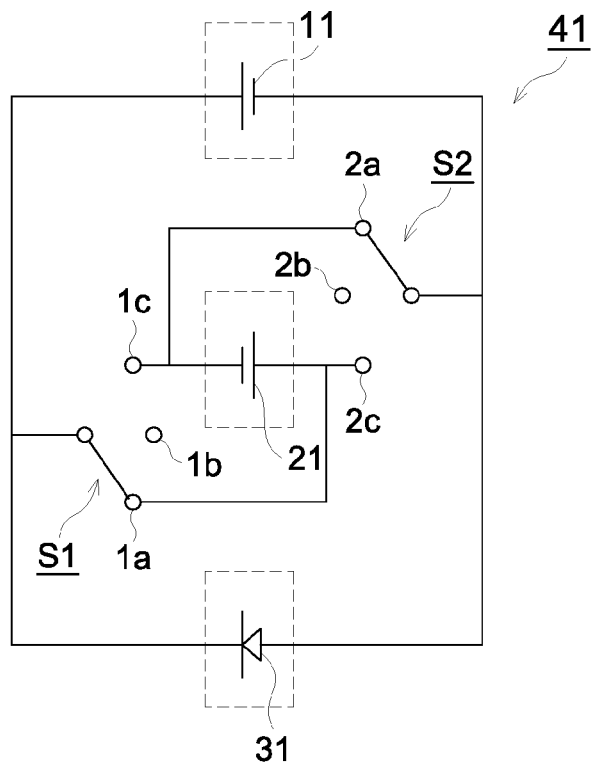
FIG. 3 is a figure showing a connection of a circuit at the time of charging.

FIG. 3 is a figure showing a connection of a circuit at the time of charging. In the daytime, OPV 11 generates electric power by receiving irradiation of sunlight. At this time, control section 40 controls switching so that switches S1 and S2 connect with contacts 1a and 2a, respectively. With this control, OPV 11 is connected with secondary cell 21, and direct current electric power generated by OPV 11 is stored in secondary cell 21.

On the other hand, since OLED 31 and OPV 11, and OLED 31 and secondary cell 21 are respectively connected with a reverse polarity, a reverse bias voltage is applied to OLED 31. The above reverse bias voltage is preferably adjusted in the range of −0.5 to −30 V. When the voltage is not less than −0.5 V, the effect of the voltage application is small, and when the voltage is not larger than −30 V, the OLED is likely to break. The above reverse bias voltage is more preferably in the range of −5 to −15 V.

With this, carriers accumulated in the local site of foregoing OLED 31 can be taken out to result in reduction of degradation of OLED 31, and thereby durability can be improved.

A determination whether it is daytime or not is carried out by detecting illuminance of the surroundings by an illuminance detection means (the above organic photoelectric conversion element may doubles as the means, or a light sensor may be separately arranged), and then, by comparing, at control section 40, the above detected illuminance with the reference illuminance having been set in advance. If it is higher than the above reference illuminance, control section 40 determines that it is daytime, and then controls the connection shown in FIG. 3.

Control section 40 is preferably provided with an overcharge protection mechanism (not illustrated) to prevent secondary cell 21 from overcharge. The above overcharge protection is carried out in such a way that the connection between secondary cell 21 and OPV 11 is cut off at each prescribed time step during the above charging, and then, an open voltage of secondary cell 21 is measured, after which the measured value is compared with the overcharge protection voltage having been set in advance. In the case where the above open voltage exceeds the above overcharge protection voltage, the charging is stopped, and the connection is switched to a connection at the time of light-emission shown in FIG. 4 to be described below, and then secondary cell 21 is discharged. In the case where the above open voltage becomes lower than the above overcharge protection voltage, charging is resumed.

The above prescribed time is appropriately set based on ability of generation of electricity of OPV 11, capacity of secondary cell 21, a discharge rate, and the like.

With this, the secondary cell can be protected from overcharge, and thereby durability of the entire lighting device can be improved.

Further, it is preferable that, during the above charging, the connection between secondary cell 21 and OPV 11 is cut off temporarily at each fixed time (for example, 1 millisecond per minute), and a reverse bias voltage is applied to OPV 11. In this case, switches S1 and S2 are switched to 1c and 2c respectively in the circuit shown in FIG. 3, and as a result, the polarity of secondary cell 21 and OPV 11, and the polarity of secondary cell 21 and OLED 31 are respectively reversed, and thereby, a regular bias and a reverse bias voltage are applied to OLED 31 and OPV 11 respectively. The interval and time of applying the above reverse bias voltage are appropriately set based on specifications of OPV 11, experiments, and the like.

With this, carriers accumulated in the local site of OPV 11 can be taken out, and thereby durability of OPV 11 can be improved.

[At the Time of Light-emission]

Figure 4:
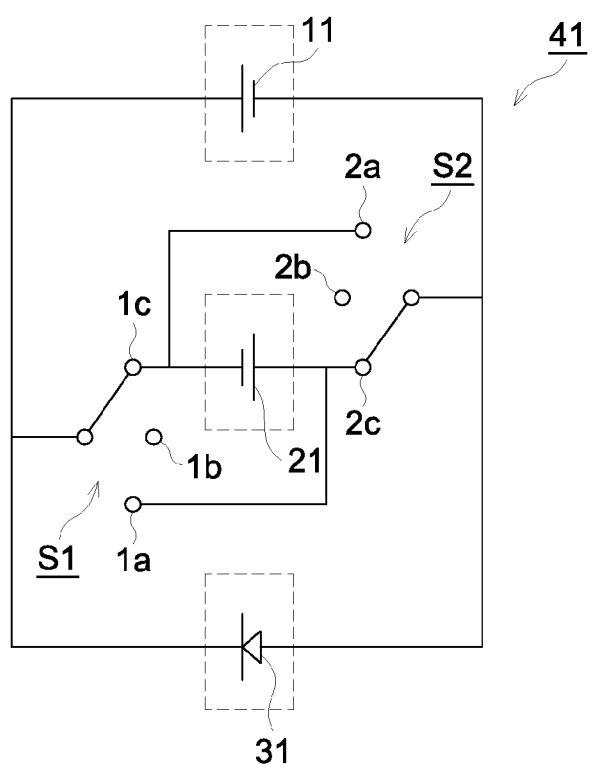
FIG. 4 is a figure showing a connection of a circuit at the time of light emission.

FIG. 4 is a figure showing a connection of a circuit at the time of light emission. At night (at the time of light emission), OLED 31 emits light by electric power being supplied from secondary cell 21. At this time, control section 40 controls switching so that switches S1 and S2 connect with contacts 1c and 2c, respectively. With this control, OLED 31 is connected with secondary cell 21 with a regular bias, and electric power stored in secondary cell 21 is supplied to OLED 31, which then emits light.

At the same time, a reverse bias with regard to secondary cell 21 is applied to OPV 11. The above reverse bias voltage is preferably adjusted in the range −0.5 to −30 V. When the voltage is more than or equal to −0.5 V, the effect of the application is small, and when the voltage is less than or equal to −30 V, the OPV is likely to break. The above reverse bias voltage is more preferably in the range of −5 to −15 V.

With this, similarly to the case of OLED 31, carriers accumulated in the local site of OPV 11 can be taken out to result in reduction of degradation of OPV 11, and thereby durability can be improved.

A determination whether it is nighttime or not is carried out by detecting illuminance of the surroundings by an illuminance detection means (the above organic photoelectric conversion element may doubles as the means, or a light sensor may separately be arranged), and then comparing, at control section 40, the above detected illuminance with the reference illuminance having been set in advance. If it is less than the above reference illuminance, control section 40 determines that it is nighttime, and then controls the connection shown in FIG. 4.

Further, it is preferable that, during the above light emission, the connection between secondary cell 21 and OLED 31 is cut off temporarily at each fixed time (for example, 1 millisecond per minute), and a reverse bias voltage is applied to OLED 31. Preferable reverse bias application time is such that a ratio of ON time to OFF time is 10:1 to 1 million:1, and more preferably 100:1 to 100 thousand:1. In this case, switches S1 and S2 are switched to 1a and 2a respectively in the circuit shown in FIG. 4, and then, a reverse bias voltage is applied to OLED 31 from secondary cell 21. The interval and time of applying the above reverse bias voltage are appropriately set based on specifications of OLED 31, permissible light-emission stop time, experiments, and the like. The light-emission stop time is preferably sufficiently short so that it seems difficult for people to recognize it.

With this, carriers accumulated in the local site of OLED 31 can be taken out, and thereby durability of OLED 31 can be improved.

Hereinafter, the constitutions of an organic EL element (an organic light-emitting diode), an organic photoelectric conversion element, and a secondary cell constituting the lighting device of the present invention, and methods for preparing thereof will be described.

<<Organic EL Element>>

A light and thin lighting device which is suitable for carrying around and is usable without an electric outlet can be achieved by using an organic electroluminescence element as a light-emitting element.

Preferred embodiments of an organic electroluminescence element relating to the present invention will be described, but the invention is not limited to them. As the organic electroluminescence element, it is not particularly limited, and any diode may be used as long as it is an element having a positive electrode, a negative electrode, and at least one organic layer sandwiched between the both electrodes, and emits light when an electric current is flowed.

Preferred specific examples of the layer structure of the organic electroluminescence element are shown below.
(i) positive electrode/light emission layer/electron transport layer/negative electrode,
(ii) positive electrode/positive hole transport layer/light emission layer/electron transport layer/negative electrode,
(iii) positive electrode/positive hole transport layer/light emission layer/positive hole inhibition layer/electron transport layer/negative electrode,
(iv) positive electrode/positive hole transport layer/light emission layer/positive hole inhibition layer/electron transport layer/negative electrode buffer layer/negative electrode,
(v) positive electrode/positive electrode buffer layer/positive hole transport layer/light emission layer/positive hole inhibition layer/electron transport layer/negative electrode buffer layer/negative electrode, and
(vi) positive electrode/positive hole transport layer/first light emission layer/electron transport layer/intermediate electrode/positive hole transport layer/second light emission layer/electron transport layer/negative electrode The light emission layer preferably contains at least two kinds of light emission material having different light emission colors from each other, and may form a single layer or a unit of light emission layer comprising a plurality of light emission layers. Further, the light emission layer may have a tandem structure (the structure (vi)) in which a plurality of light emission stacks themselves are laminated. The positive hole transport layer also includes a positive hole injection layer and an electron inhibition layer.

Each of the above layers can be formed by well-known methods such as, for example, a vacuum vapor deposition method, a spin coat method, and a casting method, but a coating method, in which a coating solution, a liquid composite, is applied to a substrate via coating means such as a coater, and an inkjet to form a coated film layer, the so-called solution process method, is preferable in view of improvement of production.

<Light Emission Layer>

The light emission layer is a layer, which emits light via recombination of electrons and positive holes injected from an electrode or an electron transport layer or a positive hole transport layer, and the light emitting portion may be present either within the light emission layer or at the interface between the light emission layer and an adjacent layer thereof. The above light emission layer has no particular limit in its constitution, as long as a light emitting material contained therein satisfies the above required conditions. Further, there may be a plurality of layers having the same emission spectrum or an emission maximum wavelength.

A non-light emission intermediate layer is preferably present between each of light emission layers.

The total film thickness of the light emission layers is preferably in the range of 1 to 100 nm, and more preferably less than or equal to 30 nm since a lower driving voltage can be obtained. The total film thickness of the light emission layers means, in the case where the non-light emission intermediate layer is present between the light emission layers, a film thickness including the aforesaid intermediate layer.

The film thickness of each light emission layer is preferably regulated in the range of 1 to 50 nm, and more preferably in the range of 1 to 20 nm. There is no particular limit in the relationship among film thicknesses of each of blue, green and red light emission layers.

For the preparation of the light emission layer, light emission materials or host compounds to be described below are used to form a film by well-known thin layer forming methods such as, for example, a vacuum vapor deposition method, a spin coat method, a casting method, an LB method, and an inkjet method, to form the light emission layer.

In each light emission layer, a plurality of light emission materials may be blended, and further, a phosphorescent light-emitting material and a fluorescent light-emitting material may be used by blending them in the same light emission layer.

As a constitution of the light emission layer, a host compound and a light emission material (also referred to as a light emission dopant) are incorporated, and the light emission material preferably emits light.

The host compound incorporated in the light emission layer of the organic electroluminescence element is preferably a compound in which a phosphorescence quantum yield of phosphorescent light emission at a room temperature (at 25° C) is less then 0.1. More preferably, the phosphorescence quantum yield is less than 0.01. Further, in the light emission layer, the volume ratio of the host compound among compounds incorporated in the layer is preferably more than or equal to 50%.

As the host compound, a commonly-known host compound may be singly used, or a combination of a plurality of them may be used. Use of a plurality of host compounds makes the control of charge transfer possible, to result in higher efficiency of the organic electroluminescence element. Also use of a plurality of light emission materials to be described below makes it possible to mix various kinds of light emission, and thereby, an optional color of light emission can be obtained.

As the host compound, usable may be commonly-known low molecular compounds, high molecular compounds having repeating units, or low molecular compounds having a polymerizable group such as a vinyl group and an epoxy group (a vapor deposition polymerizable light emission host).

The commonly-known host compounds preferably have positive hole transporting capability and electron transporting capability, as well as prevent emitted light from exhibiting a longer wavelength, and exhibit high Tg (a glass transition temperature). The term "glass transition temperature (Tg)" means a value determined by the DSC (the differential scanning colorimetry) based on a method of JIS-K-7121.

Next, light emission materials will be described.

As the light emission material, usable are a fluorescent compound or a phosphorescent light-emitting material (also referred to as a phosphorescent compound or a phosphorescent light-emitting compound).

The above phosphorescent light-emitting material is defined as a compound in which light emission from an excited triplet is observed, and specifically a compound emitting phosphorescent light at a room temperature (at 25° C), and having a phosphorescence quantum yield of more than or equal to 0.01 at 25° C, but the preferable phosphorescence quantum yield is more than or equal to 0.1.

The above-described phosphorescence quantum yield can be determined according to a method described in the fourth edition, Jikken IC agaku Koza 7, Bunko II (Spectroscopy II, Experimental Chemistry Course 7), p. 398 (1992) published by Maruzen. The phosphorescence quantum yield in a solution can be determined employing various kinds of solvents. In the case where the phosphorescent light-emitting material is used in the present invention, the above phosphorescent light-emitting material is acceptable as long as the above phosphorescence quantum yield (more than or equal to 0.01) is achieved in any one of arbitrary solvents.

The phosphorescent light-emitting material can be appropriately selected among commonly-known materials used in the light emission layer of organic electroluminescence element, but preferably a complex compound incorporating a metal of Groups 8 to 10 of the Periodic Table of the Elements. More preferably are an iridium compound, an osmium compound, a platinum compound (a platinum complex compound), or a rare-earth complex. Among them, most preferable is an iridium compound.

As the specific iridium compounds, usable are described in Journals such as Organic Letter, vol. 3, No. 16, pp. 2579-2581 (2001), Inorganic Chemistry vol. 30, No. 8, pp. 1685-1687 (1991), J. Am. Chem. Soc., vol. 123, p. 4304 (2001), Inorganic Chemistry vol. 40, No. 7, pp. 1704-1711 (2001), Inorganic Chemistry vol. 41, No. 12, pp. 3055-3066 (2002), New Journal of Chemistry, vol. 26, p. 1171 (2002), and European Journal of Organic Chemistry Vol. 4, pp. 695-709 (2004).

In the present invention, more than or equal to two kinds of light emission material may be incorporated in at least one light emission layer, and a concentration ratio of the light emission materials in the light emission layer may be changed in the thickness direction of the light emission layer.

<Intermediate Layer>

A case where non-light emitting intermediate layers (also referred to as a non-doping area and the like) are arranged between each of light emission layers will be described.

The term "non-light emitting intermediate layer" means, in the case where a plurality of light emission layers are arranged, a layer which is arranged between the light emission layers.

The thickness of the non-light emitting intermediate layer is preferably in the range of 1 to 20 nm, and more preferably in the range of 3 to 10 nm, from view points that an interaction between adjacent light emission layers, such as an energy transfer, is restrained, as well as no large load is applied to current and voltage characteristics of an element.

The materials used in this non-light emitting intermediate layer may be the same as or different from a host compound in the light emission layer, but is preferably the same as the host material in at least one light emission layer of adjacent two light emission layers.

The above host material is preferably a material having an ability of carrier transport to take a role of carrier transportation. As a physical property representing the ability of carrier transport, carrier mobility is used, and, in general, the carrier mobility of an organic material is likely to depend on electric field strength. Since a material having a high dependence on electric field is likely to loose injection/transport balance of positive holes or electrons, materials having less mobility dependence on electric field are preferably used for the intermediate material and a host material.

On the other hand, it is also proposed as a preferable embodiment that, in order to appropriately control injection balance of positive holes or electrons, the non-light emitting intermediate layer functions as an inhibition layer to be described below, that is, a positive hole inhibition layer or an electron inhibition layer.

<Injection Layer: Electron Injection Layer and Positive Hole Injection Layer>

The injection layer is provided as the need arises and includes an electron injection layer and a positive hole injection layer, which, as described above, may be present between a positive electrode and a light emission layer or a positive hole transport layer, or between a negative electrode and a light emission layer or an electron transport layer.

The injection layer means a layer arranged between an electrode and an organic layer to decrease in driving voltage or to improve light emission brightness, and is described in detail in "Yuki Denkai Hakko Soshi To Kogyoka Saizensen (Organic EL Element and Frontier of Its Industrialization), (published by NTS Co., on Nov. 30, 1998)" Part 2, Chapter 2 "Denkyoku Zairyo (Electrode Material)" (pp. 123-166), and including a positive hole injection layer (a positive electrode buffer layer) and an electron injection layer (a negative electrode buffer layer).

<Inhibition Layer: Positive Hole Inhibition Layer and Electron Inhibition Layer>

The inhibition layer is, as described above, a basic constitution layer of an organic compound thin layer, and other than that, is provided as the need arises. For example, the inhibition layer includes a positive hole inhibition (a hole block) layer, which is described in JP-A Nos. H11-204258, and H11-204359, and in "Yuki Denkai Hakko Soshi To Kogyoka Saizensen (Organic EL Element and Frontier of Its Industrialization), (published by NTS Co., on Nov. 30, 1998)" (p. 237, etc.).

The positive hole inhibition layer has, in a broad sense, a function of an electron transport layer, and is composed of a positive hole inhibition material which has an electron transport function as well as has significantly small ability to transport positive holes. The positive hole inhibition layer can increase the recombination probability of electrons and positive holes by transporting electrons as well as inhibiting positive holes. In addition to that, a constitution of an electron transport layer to be described below can be used as the positive hole inhibition layer relating to the present invention as the need arises. The positive hole inhibition layer is preferably provided adjacent to a light emission layer.

On the other hand, the electron inhibition layer has, in a broad sense, a function of a positive hole transport layer, and is composed of a material which has a positive hole transport function as well as having significantly small ability to transport electrons. Further, the electron inhibition layer can increase the recombination probability of electrons and positive holes by transporting positive holes as well as inhibiting electrons. In addition to that, a constitution of a positive hole transport layer to be described below can be used as the electron inhibition layer as the need arises. The film thickness of the positive hole inhibition layer and the electron inhibition layer relating to the present invention is preferably 3 to 100 nm, and more preferably, 5 to 30 nm.

<Positive Hole Transport Layer>

The positive hole transport layer is composed of a positive hole transport material having a positive hole transport function, and, in a broad sense, a positive hole injection layer and an electron inhibition layer are also included in the positive hole transport layer. As the positive hole transport layer, a single layer or a plurality of layers may be arranged.

The positive hole transport material has either injection or transport properties of positive holes, or barrier properties of electrons, and may be either an organic or inorganic material. For example, included are triazole derivatives, oxadiazole derivatives, imidazole derivatives, polyarylalkane derivatives, pyrazoline and pyrazolone derivatives, phenylenediamine derivatives, arylamine derivatives, aminosubstituted chalcone derivatives, oxazole derivatives, styrylanthracene derivatives, fluorenone derivatives, hydrazone derivatives, stilbene derivatives, silazane derivatives, aniline-series copolymers, or conductive polymer oligomer, especially, thiophene oligomer.

As the positive hole transport material, above materials can be used, but preferably used are porphyrin compounds, aromatic tertiary amine compounds, and styrylamine compounds, and among them, especially preferably used are aromatic tertiary amine compounds.

Further, also usable are polymer materials in which the above materials are introduced in their polymer chains or used as main chains of polymer. Further, inorganic materials such as p-type Si, p-type SiC, nickel oxide, and molybdenum oxide are usable, as a positive hole injection material, or a positive hole transport material.

Moreover, so-called p-type positive hole transport materials such as described in JP-A H11-251067, and a document (Applied Physics Letters 80 (2002), p. 139) authored by J. Huang et al. can also be used. In the present invention, these materials are preferably used, since a higher efficient light emitting element can be obtained.

There is no particular limit to the film thickness of the positive hole transport layer, but it is usually about 5 nm to about 5 μm, and preferably 5 to 200 nm. The positive hole transport layer may be a single layer structure configured with one or at least two kinds of the above materials.

Further, a positive hole transport layer, having a high p-characteristic and in which impurity is doped, can also be used. Examples thereof are included in JP-A Nos. H4-297076, 2000-196140, and 2001-102175, and J. Appl. Phys., 95, 5773 (2004).

In the present invention, it is preferable to use such the positive hole transport layer having a high p-characteristic, since an element of lower power consumption can be prepared.

<Electron Transport Layer>

The electron transport layer is composed of a material having an electron transport function, and, in a broad sense, an electron injection layer and a positive hole inhibition layer are also included in the electron transport layer. As the electron transport layer, a single layer or a plurality of layers can be arranged.

Heretofore, in the case of an electron transfer layer of a single or a plurality of layers, any electron transfer materials (which double positive hole inhibition materials) can be used in the electron transfer layer adjoining a negative electrode side with respect to a light emission layer as long as the material has a function of transferring injected electrons from the negative electrode to the light emission layer. As the material, any compound can be used by selecting one from conventionally well-known compounds, and examples include nitro-substituted fluoren derivatives, diphenylquinone derivatives, thiopyrandioxide derivatives, carbodiimide, fluorenylidene methane derivatives, anthraquinodimethane and anthrone derivatives, or oxadiazole derivatives. In addition, thiadiazole derivatives in which an oxygen atom of oxadiazole ring is substituted by a sulfur atom in the above oxadiazole derivatives, and quinoxaline derivatives which have a quinoxaline ring known as an electron attraction group are also used as the electron transfer material. Further, also usable are polymer materials in which the above materials are introduced in their polymer chains or used as main chains of polymer.

Further, usable as the electron transfer material are metal complexes of 8-quinolinol derivatives, for example, tris(8-quinolinol)aluminum ($Alq_3$), tris(5,7-dichloro-8-quinolinol) aluminum, tris(5,7-dibromo-8-quinolonol)aluminum, tris(2-methyl-8-quinilinol)aluminum, tris(5-methyl-8-quinolinol) aluminum, and bis(8-quinolinole)zinc (Znq), and metal complexes in which the central metal of the above metal complexes is substituted by In, Mg, Cu, Ca, Sn, Ga, or Pb can also be used as the electron transfer material. In addition to them, preferably usable as the electron transfer materials are compounds of metal-free or metal phthalocyanine, or those in which terminal of which is substituted by an alkyl group or a sulfonic acid group. Further, distylpyrazine derivatives, which were exemplified as a material of the light emission material, can also be used as the electron transfer material, and, similarly to the positive hole injection layer or the positive hole transport layer, inorganic semiconductors such as an n-type Si, an n-type SiC, and the like can also be used as the electron transfer material.

There is no particular limit to the film thickness of the electron transport layer, but it is usually about 5 nm to about 5 μm, and preferably 5 to 200 nm. The electron transport layer may be a single layer structure configured with one or at least two kinds of the above materials.

Further, an electron transport layer, having a high n-characteristic and in which impurity is doped, can also be used. Examples thereof are included in JP-A Nos. H4-297076, H10-270172, 2000-196140, and 2001-102175, and J. Appl. Phys., 95, 5773 (2004).

In the present invention, it is preferable to use such the electron transport layer having a high n-characteristic, since an element of lower power consumption can be prepared.

Further, inorganic oxides (such as titanium oxide, and zinc oxide) having n-type conductivity can also be used.

<Electrode>

The surface light emitting element relating to the present invention has at least the primary electrode and the secondary electrode. In the case of using an organic electroluminescence element, it is usually constituted of a positive electrode as one electrode and a negative electrode as the other electrode. In the case of adopting a tandem structure, it can be achieved by using an intermediate electrode. Preferable structures of a positive electrode and a negative electrode will be described below.

<Positive Electrode>

As the positive electrode of the organic electroluminescence element, preferably used is an electrode in which a metal, an alloy, an electric conductive compound, or a mixture thereof, which has a large work function (more than or equal to 4 ev), is used as an electrode material. Specific examples of such an electrode material include a thin film of metal such as gold, silver, and platinum, a nano-particle/nano-wire layer, an electric conductive transparent material such as an indium-tin oxide (an ITO), $SnO_2$, and ZnO, or an electric conductive polymer. Also, a material such as IDIXO ($IN_2O_3$—ZnO), by which an amorphous and light transparent electric conductive film can be prepared, may be used. The sheet resistance as the positive electrode is preferably less than or equal to several hundred $\Omega/\square$. The film thickness, depending on the material, is selected from the region of usually 10 to 1,000 nm, and preferably 10 to 200 nm.

<Negative Electrode>

On the other hand, as the negative electrode, used is an electrode in which a metal (referred to as an electron injection metal), an alloy, an electric conductive compound, or a mixture thereof, which has a small work function (less than or equal to 4 ev), is used as an electrode material. Specific examples of such an electrode material include sodium, sodium/potassium alloy, magnesium, lithium, magnesium/copper mixture, magnesium/silver mixture, magnesium/aluminum mixture, magnesium/indium mixture, aluminum/aluminum oxide ($Al_2O_3$) mixture, indium, lithium/aluminum mixture, or a rare-earth metal.

Among them, in view of an electron injection property and durability against oxidation and the like, appropriate are a mixture between the electron injection metal and the secondary metal which is a metal having a larger value of work function than that of the electron injection metal and thereby being stable, which mixture includes, for example, magnesium/silver mixture, magnesium/aluminum mixture, magnesium/indium mixture, aluminum/aluminum oxide ($Al_2O_3$) mixture, lithium/aluminum mixture, or aluminum. The sheet resistance as the negative electrode is preferably less than or equal to several hundred $\Omega/\square$, and the film thickness is selected from the region of usually 10 nm to 5 μm, and preferably 50 to 200 nm.

In order to allow the emitted light to pass through, either one of positive electrode and negative electrode of the organic electroluminescence element can be constituted by appropriately using the above electrode material so that the electrode becomes transparent. In the case where light reflectivity is given to the positive electrode side, a light reflective positive electrode can be made by using, for example, aluminum, an aluminum alloy, silver, or a silver compound. Further, the light reflection layer using the above material and the light transparent positive electrode composed of the above ITO, $SnO_2$, or ZnO can also be used in combination thereof. In the case where light transparency is given to the negative electrode side, a light transparent negative electrode can be made by preparing a thin layer of about 1 nm to about 20 nm with a conductive material such as aluminum, an aluminum alloy, silver, or a silver compound, after which a film of the electric conductive transparent material listed in the above description on the positive electrode is arranged.

<Intermediate Electrode>

As a material of an intermediate electrode required for the case of the tandem structure like the above structure (vi), preferable is a layer using a compound having both transparency and electric conductivity, and preferable are a transparent metal oxide such as ITO, AZO, FTO, and titanium oxide; a very thin metal layer composed of Ag, Al, Au, and the like; or electrically conductive polymer materials such as a layer containing nano-particle/nano-wire, PEDOT:PSS, and polyaniline.

Among the above described positive hole transport layers and electron transport layers, there are some layers which work as the intermediate electrode (a charge recombination layer) when some of them are suitably combined and are laminated. The above constitution is preferable since a process of forming one layer can be omitted.

<Sealing>

A sealing means used for sealing the organic electroluminescence element of the present invention includes, for example, a method for adhering a sealing member to an electrode or a supporting board with an adhesive.

The sealing member may be arranged so as to cover a display area of the organic electroluminescence element, and may be a concave or flat board. The transparency and insulation property are not particularly limited.

In the present invention, from a reason that an element can be prepared as a thin film, a polymer film or a metal film can be preferably used. Further, the polymer film preferably has an oxygen permeability of less than or equal to $10^{-3}$ $g/m^2$/day, and a water vapor permeability of less than or equal to $10^{-3}$ $g/m^2$/day. The above both water vapor permeability and oxygen permeability are more preferably less than or equal to $10^{-5}$ $g/m^2$/day.

Further, there can be used methods such as a spin coat method for applying an organic polymer material having a high gas bather property (such as polyvinyl alcohol), a method for piling up under vacuum an inorganic thin film having a high gas bather property (such as silicon oxide, and aluminum oxide) or an organic film (such as parylene), and a method for laminating these layers in a composite manner.

<Substrate>

In the case where light to be subjected to photoelectric conversion enters from a substrate side, the substrate is preferably a member through which the light to be subjected to photoelectric conversion can be transmitted, that is, the member is transparent to wavelength of the light to be subjected to photoelectric conversion. The substrate appropriately includes, for example, a glass substrate, or a resin substrate, but it is desirable to use a transparent resin film, in view of lightness and flexibility. The transparent resin film, which can be preferably used as the transparent substrate in the present invention, is not limited, and the material, shape, structure, thickness and the like thereof can be appropriately selected from commonly-known transparent resin films. Included are, for example, polyester-type resin films such as polyethylene terephthalate (PET), and polyethylene naphthalate (PEN) modified polyester; polyolefin resin films such as polyethylene (PE) resin film, polypropylene (PP) resin film, polystyrene resin film, and cyclic olefin-type resin; vinyl-type resin films such as polyvinyl chloride, and polyvinylidene chloride; polyether ether ketone (PEEK) resin film; polysulfone (PSF) resin film; polyether sulfone (PSE) resin film; polycarbonate (PC) resin film; polyamide resin film; polyimide resin film; acryl resin film; or triacetylcellulose (TAC) resin film. Any resin film can be preferably applied to the transparent resin film relating to the present invention, as long as the resin film has transmissivity in visible light region (380 to 800 nm) of more than or equal to 80%. Of these films, in terms of transparency, heat resistance, ease in handling, strength, and cost, preferable are biaxial stretching polyethylene terephthalate film, biaxial stretching polyethylene naphthalate film, polyether sulfone film, or polycarbonate film, and more preferably are biaxial stretching polyethylene terephthalate film, or biaxial stretching polyethylene naphthalate film.

In order to secure wettability or adhesiveness of a coating solution, the transparent substrate used in the present invention may be subjected to surface treatment, or an easy-adhesive layer may be arranged on the substrate. Regarding the surface treatment or the arrangement of the easy-adhesive layer, conventional commonly-known technologies can be used. As the surface treatment, included are, for example, surface activation treatments such as a corona discharge treatment, a flame treatment, an ultraviolet treatment, a high-frequency wave treatment, a glow discharge treatment, an active plasma treatment, and a laser treatment. As a compound used for the easy-adhesive layer, included are polyester, polyamide, polyurethane, vinyl-type copolymer, butadiene-type copolymer, acryl-type copolymer, vinylidene-type copolymer, or epoxy-type copolymer.

For the purpose of restraining penetration of oxygen and water vapor, a barrier coat layer may in advance be formed.

<Protective Film and Protective Board>

There may be arranged a protective film or a protective board to enhance mechanical strength of the element on the outer side of the above polymer sealing film or the above film with gas barrier layer, which is located on the opposite side to the supporting substrate, with the organic layers being sandwiched between the above film and the substrate. In particular, in the case where the sealing is carried out by the above sealing film, since the mechanical strength thereof is not necessarily high, such the protective film or protective board may be preferably arranged. As the material used for the protective film or protective board, there may be used a glass board, a polymer board/film, a metal plate/film, and the like, which are similar to those used for the above sealing, but the polymer film is preferably used in terms of making the protective film or protective board lighter and thinner.

<Light Extraction>

It is generally said that an organic electroluminescence element emits light in a layer which has a higher refractive index than air (the refractive index is about 1.6 to about 2.1), and the light of only about 15% to about 20% of the emitted light in the light emission layer can be extracted out. This is because the light, entering into an interface (an interface between a transparent substrate and air) at an angle θ of more than or equal to the critical angle, is fully reflected, and thereby, cannot be extracted out of an element, or the light is fully reflected between a transparent electrode or a light emission layer and a transparent substrate, and is waveguided through the transparent electrode or the light emission layer, and as a result, the light goes out in the side direction of the element.

In the present invention, these methods can be used in combination with the element relating to the present invention, but there can be appropriately used a method in which a flat layer having a lower refractive index than that of a substrate is introduced between the substrate and the light emitting body, or a method in which a diffraction grating is formed between any of either the substrate, the transparent electrode layer or the light emission layer (including between the substrate and the outside). According to the present invention, by combinations of these means, an element having higher brightness or more excellent durability can be obtained.

If a medium having a low refractive index is formed between the transparent electrode and the transparent substrate with a thickness of larger than light wavelength, the light having come out of the transparent electrode exhibits higher efficiency of extraction of light to the outside, as the refractive index of the medium is lower.

A material used for the low refractive index layer includes, for example, aerogel, porous silica, magnesium fluoride, or fluorine-type polymer. Since the refractive index of the transparent substrate is, in general, about 1.5 to about 1.7, the refractive index of the low refractive index layer is preferably lower than or equal to about 1.5, and more preferably lower than or equal to 1.35.

Brightness in a specified direction of the surface light emitting element relating to the present invention can be enhanced by condensing light in the specified direction, for example, in the front direction with regard to the light emitting surface of element, by processing the surface light emitting element to arrange, for example, a structure on the microlens array at the light extraction side of the supporting substrate, or by combining the surface light emitting element with so-called light focusing sheet.

An example of the microlens array is configured in such a way that quadrangular pyramids with a side length of 30 μm and a vertex angle of 90 degrees are two-dimensionally arranged on the light extraction side of the substrate. The side length is preferably 10 to 100 μm. If the side length is smaller than the above size, a diffraction effect is produced to cause color, and if it is larger than that, the thickness becomes larger, both of which are undesirable.

As the light focusing sheet, it is possible to use one which has already been commercialized in an LED backlight of a liquid crystal display device. Examples of such a sheet include Brightness Enhancement Film (BEF) produced by Sumitomo 3M Co. The form of the prism sheet may be, for example, one in which triangular stripes with a vertex angle of 90 degrees are formed at a pitch of 50 μm on a substrate, one with the vertex angle being rounded, one in which the pitch is randomly varied, or another form.

Further, a light-diffusing plate or film may be used in combination with a light focusing sheet to control a radiation angle of light emitted from a light emitting element. For example, a diffusion film (LIGHT-UP) produced by Kimoto Co., Ltd. can be used.

<<Organic Photoelectric Conversion Element>>

A light and thin lighting device which is suitable for carrying around and is usable without an electric outlet can be achieved by using an organic electroluminescence element as an electric power generation element.

Preferred embodiments of the organic photoelectric conversion element relating to the present invention will be described, but the invention is not limited to them. As the organic photoelectric conversion element, there is no particular limit, and any one may be used as long as it has a positive electrode, a negative electrode, and at least one electric power generation layer sandwiched between the positive electrode and the negative electrode (being a layer in which a p-type semiconductor and an n-type semiconductor are mixed, also referred to as a bulk hetero junction layer, or an Mayer), and generates electric current when light is irradiated.

Preferred specific examples of layer structures of the organic photoelectric conversion element are shown below.

(i) positive electrode/electric power generation layer/negative electrode,
(ii) positive electrode/positive hole transport layer/electric power generation layer/negative electrode,
(iii) positive electrode/positive hole transport layer/electric power generation layer/electron transport layer/negative electrode,
(iv) positive electrode/positive hole transport layer/p-type semiconductor layer/electric power generation layer/n-type semiconductor layer/electron transport layer/negative electrode, and
(v) positive electrode/positive hole transport layer/primary light emission layer/electron transport layer/intermediate electrode/positive hole transport layer/secondary light emission layer/electron transport layer/negative electrode The electric power generation layer is required to incorporate a p-type semiconductor material which can transports positive holes and an n-type semiconductor material which can transports electrons, and the electric power generation layer may form a hetero junction with substantially two layers, or may form a bulk hetero junction being in a state of mixture in the interior of one layer, but the bulk hetero junction structure is preferable since it has a higher photoelectron conversion efficiency. The p-type semiconductor material and the n-type semiconductor material used in the electric power generation layer will be described later. Similarly to an organic EL element, since extraction efficiency of positive holes and electrons into a positive electrode and a negative electrode can be enhanced by sandwiching the electric power generation layer between a positive hole transport layer and an electron transport layer, the structures having them (structures (ii) and (iii)) are preferable. In order for the electric power generation layer itself to enhance rectification property (selectivity of extraction of carriers) of positive holes and electrons, a structure, such as structure (iv), in which the electric power generation layer is sandwiched between layers composed of a single p-type semiconductor material and a single n-type semiconductor material (also referred to as a p-i-n structure), may also be accepted. Further, to enhance a use efficiency of sunlight, a tandem structure (the structure (v)), in which each of the electric power generation layers absorbs sunlight having different wavelength, may also be accepted.

Layers other than the electric power generation layer to be described below can be formed using similar materials to those used for the organic EL element, if the HOMO/LUMO levels of the above materials match with those of materials used for the electric power generation layer.

<p-Type Semiconductor Material>

The p-type semiconductor material used for the electric power generation layer of the present invention (a bulk hetero junction layer) includes various condensed low-molecular weight polycyclic aromatic compounds or conjugate polymers.

Condensed low-molecular weight polycyclic aromatic compound includes, for example, compounds such as anthracene, tetracene, pentacene, hexacene, heptacene, chrysene, pysene, fuluminene, pyrene, perpyrene, perylene, terylene, quoterylene, coronene, ovalene, circumanthracene, bisanthene, sesulene, heptasesulene, pyranthrene, violanthene, isoviolanthene, circobiphenyl, and anthradithiophene; porphyrin or copper phthaloeyanine, tetrathiafulvalene (TTF)-tetracyanoquinodimethane (TCNQ) complex, bisethylenetetrathiafulvalene (BEDTTTF)-perchloric acid complex, and derivatives or precursors thereof.

Examples of derivatives having condensed poly-cycles include pentacene derivatives having a substituent described in International Publication WO 03/16599 Pamphlet, International Publication WO 03/28125 Pamphlet, U.S. Pat. No. 6,690,029, JP-A No. 2004-107216, and the like; pentacene precursors described in U.S. Patent application disclosure 2003/136964, and the like; or acene-type compound substituted with a (trialkylsilyl)ethynyl group described in J. Amer. Chem. Soc., vol. 127. No. 14. 4986, J. Amer. Chem. Soc., vol. 123. p 9482, J. Amer. Chem. Soc., vol. 130 (2008), No. 9, 2706, and the like.

Conjugate polymer includes, for example, polymer materials such as polythiophene such as poly(3-hexylthiophene) (P3HT) and oligomer thereof; or polythiophene having a polymerizable group described in Technical Digest of the International PVSEC-17, Fukuoka, Japan, 2007. p 1225; polythiophene-thienothiophene copolymer described in Nature Material, (2006) vol. 5, p 328; polythiophene-diketopyrrolopyrrol copolymer described in WO 2008000664; polythiophene-thiazolothiazole copolymer described in Adv. Mater, 2007, p. 4160; polythiophene copolymer such as PCP-DTBT described in Nature Mat. vol. 6 (2007), p. 497; polypyrrole and its oligomer; polyaniline; polyphenylene and its oligomer, polyphenylene vinylene and its oligomer; polythie-nylene vinylene and its oligomer; and sigma conjugate type polymer such as polyacethylene, polydiacetylene, polysilane, and polygermane.

As an oligomer material, not a polymer material, appropriately used are oligomers such as α-sexithiophene, α,ω-dihexyl-α-sexithiophene, α,ω-dihexyl-α-quinquethiphene, α,ω-bis(3-butoxypropyl)-α-sexithiophene, all of which are thiophene hexamer.

Among these compounds, such compounds are preferable that the compound has high solubility to an organic solvent to the extent that a solution process is possible, and at the same time, forms a crystalline thin film after being dried, and can achieve high mobility.

In the case where an electron transport layer is formed on an electric power generation layer via coating, since there is a problem that an electron transport layer solution dissolves the electric power generation layer, there may be used a material which can be insolubilized after the material is coated via the solution process.

Such materials include a material, which can be insolubilized by cross-linking a film by polymerization after having been coated, such as polythiophene having a polymerizable group described in Technical Digest of the International PVSEC-17, Fukuoka, Japan, 2007, p. 1225; or a material, described in United States Patent application disclosure 2003/136964, JP-A 2008-16834, and the like, which material can be insolubilized (changed to pigment) by a reaction of a soluble substituent by applying energy such as heat.

<n-Type Semiconductor Material>

The n-type semiconductor material used for the bulk hetero junction layer of the present invention includes, but not particularly limited to, for example, fullerene, octazaporphyrin, a perfluoro compound of a p-type semiconductor (such as perfluoro pentacene, and perfluorophthalocyanine), or a high molecular compound containing an aromatic carboxyclic acid anhydride or its imide as a structure, such as naphthalenetetracarboxylic anhydride, naphthalenetetracarboxylic diimide, perylene tetracarboxylic anhydride, and perylene tetracarboxylic diimide.

However, in the case where a material having a thiophene containing condensed ring of the present invention is used as a p-type semiconductor material, fullerene derivatives which can perform efficient charge separation are preferable. The fullerene derivatives include fullerene C60, fullerene C70, fullerene C76, fullerene C78, fullerene C84, fullerene C240, fullerene C540, mixed fullerene, fullerene nanotube, multiwall nanotube, singlewall nanotube, nano horn (cone type), as well as fullerene derivatives in which a part of them is substituted with a hydrogen atom, a halogen atom, a substituted or unsubstituted alkyl group, alkenyl group, alkynyl group, aryl group, hetero aryl group, cycloalkyl group, silyl group, ether group, thioether group, amino group, or silyl group.

Among them, preferably used are fullerene derivatives having more enhanced solubility by introduction of a substituent; such as [6, 6]-phenylC6'-butyric acid methyl ester (PCBM), [6, 6]-phenylC61-butyric acid-n-butyl ester (PCBnB), [6, 6]-phenylC61-butyric acid-isobutyl ester (PCBiB), [6, 6]-phenylC61 butyric acid-n-hexyl ester (PCBH), bis-PCBM described in Adv. Mater., vol. 20 (2008), p. 2116, aminated fullerene described in JP-A No. 2006-199674, metallocene fullerene described in JP-A No. 2008-130889, and fullerene having a cyclic ether group described in U.S. Pat. No. 7,329,709.

<<Secondary Cell>>

Preferred embodiments of the secondary cell relating to the present invention will be described, but are not limited to them. The secondary cell is not particularly limited, and commonly known secondary cells can be used. However, a lithium ion secondary cell is preferable, since it is small and lightweight, provides a high voltage, and has no memory effect. More preferable is a secondary cell which is formed in a sheet shape on a flexible substrate so that it can be made compact even if it is integrated with the above organic EL element or the organic photoelectric conversion element.

Next, the constitution of the lithium ion secondary cell will be described with reference to examples, but is not limited to them.

<Negative Electrode>

A negative electrode active material is not particularly limited, and usable are metal lithium, and an alloy, an oxide compound or a carbon material, which can occlude or release lithium.

<Positive Electrode Active Material>

A positive electrode active material is not particularly limited, and examples thereof include at least one kind selected from manganese dioxide ($MnO_2$), iron oxide, copper oxide, nickel oxide, lithium manganese composite oxide (for example, $LixMn_2O_4$, or $LixMnO_2$), lithium nickel composite oxide (for example, $LixNiO_2$), lithium cobalt composite oxide ($LixCoO_2$), lithium nickel cobalt composite oxide (for example, $LiNi1-yCoyO_2$), lithium manganese cobalt composite oxide (for example, $LiMnyCo1-yO_2$), spinel type lithium manganese nickel composite oxide ($LaMn_{2-y}Ni_yO_4$), lithium phosphor oxide having olivine structure (such as, $LixFePO_4$, $LixFe1-yMnyPO_4$, and $LixCoPO_4$), iron sulfate ($Fe_2(SO_4)_3$), vanadium oxide (for example, $V_2O_5$), wherein, in these chemical formulae, x and y are preferably in the range of 0 to 1.

More preferable positive electrode active material includes lithium manganese composite oxide ($LixMn_2O_4$), lithium nickel composite oxide ($LixNiO_2$), lithium cobalt composite oxide ($LixCoO_2$), lithium nickel cobalt composite oxide ($LixNi1-yCoyO_2$), spinel type lithium manganese nickel composite oxide ($LixMn_{2-y}NiyO_4$), lithium manganese cobalt composite oxide ($LixMnyCo1-yO_2$), or lithium iron phosphate ($LixFePO_4$), all of which have a high cell voltage, wherein x and y are preferably in the range of 0 to 1. The crystallinity of these positive electrode active materials is increased by sintering them under oxidizing atmosphere, to improve cell characteristics.

<Electrode Auxiliary Conducting Material and Auxiliary Ion-conducting Material>

When an electrode is formed, an electrode auxiliary conducting material or an auxiliary ion-conducting material may be blended for the purpose of decreasing impedance. The auxiliary conducting material includes carbonaceous particulates such as graphite, carbon black, acetylene black, and vapor-grown carbon fiber; metal particulates such as copper, silver, gold, and platinum; electro conductive polymer such as polyaniline, polypyrrole, polythiophene, polyacetylene, and polyacene. The auxiliary ion-conducting material includes gel electrolyte and solid electrolyte.

<Electrode Binding Agent>

In order to strengthen bonding among each of electrode constitutional materials, an electrode binding agent may be blended. Such binding material includes resin binder such as polyvinylidene fluoride, vinylidene fluoride-hexafluoropropylene copolymer, vinylidene fluoride-tetrafluoroethylene copolymer, styrene butadiene copolymer rubber, polytetrafluoroethylene, polypropylene, polyethylene, and polyimide.

<Electrical Power Collector and Separator>

As the electrical power collector of the present invention, usable are a metal foil or a metal plate such as nickel, aluminum, copper, gold, silver, aluminum alloy, and stainless steel; a mesh electrode; or a carbon electrode. Such electrical power collector may be allowed to have a catalytic effect, or to have a chemical bonding with an active substance.

For the purpose of preventing an electrical contact between a negative electrode electrical power collector and a positive electrode electrical power collector, such a constitution may be adopted that an insulating packing made of plastic resins may be arranged between the two.

As the separator usable for the lithium secondary cell of the present invention, usable are polyolefin such as polypropylene and polyethylene, or a porous film such as fluorine resin.

<Electrolytic Solution and Electrolyte>

In the present invention, an electrolyte plays a role of charge carrier transport between a negative electrode and a positive electrode, and, in general, has ion conductivity of $10^{-5}$ to $10^{-1}$ S/cm at room temperature. As the electrolytic solution of the present invention, usable is a solution in which a lithium salt is dissolved into an organic solvent in which one or a mixture of at least two kinds of aprotic organic solvent are used; the aprotic organic solvent includes cyclic carbonates such as propylene carbonate (PC), ethylene carbonate (EC), butylene carbonate (BC), and vinylene carbonate (VC); chain carbonates such as dimethyl carbonate (DMC), diethyl carbonate (DEC), ethylmethyl carbonate (EMC), and dipropyl carbonate (DPC); aliphatic carboxylates such as methyl formate, methyl acetate, and ethyl propionate; γ-lactones such as γ-butyrolactone; chain ethers such as 1,2-diethoxyethane, and 1-ethoxy-1-methoxyethane; cyclic ethers such as tetrahydrofurane, and 2-methyl tetrahydrofurane; dimethylsulfoxide, 1,3-dioxolan, formamide, acetamide, dimethylformamide, dioxolan, acetonitrile, propylnitrile, nitromethane, ethylmonogrime, phosphate triester, trimethoxymethane, dioxolan derivatives, sulfolane, methylsulfolane, 1,3-dimethyl-2-imidazolidinone, 3-methyl-2-oxazolidinone, propylenecarbonate derivatives, tetrahydrofuran derivatives, ethyl ether, 1,3-propanesalton, anisole, or N-methylpyrrolidone.

The lithium salt includes, for example, $LiPF_6$, $LiAsF_6$, $LiAlCl_4$, $LiClO_4$, $LiBF_4$, $LiSbF_6$, $LiCF_3SO_3$, $LiCF_3CO_2$, $Li(CF_3SO_2)_2$, $LiN(CF_3SO_2)_2$, $LiB_{10}Cl_{10}$, lithium lower aliphatic carboxylate, chloroborane lithium, lithium tetraphenylborate, LiBr, LiI, LiSCN, LiCl, or imides.

A polymer electrolyte may be used in place of electrolytic solution. The high-molecular material used for these solid electrolytes includes vinylidene fluoride type polymers such as poly vinylidene fluoride, vinylidene fluoride-hexafluoropropylene copolymer, vinylidene fluoride-ethylene copolymer, vinylidene fluoride-monofluoroethylene copolymer, vinylidene fluoride-trifluoroethylene copolymer, vinylidene fluoride-tetrafluoroethylene copolymer, and vinylidene fluoride-hexafluoropropylene-tetrafluoroethylene terpolymer, or acrylonitril type polymers such as acrylonitril-methyl methacrylate copolymer, acrylonitril-methyl acrylate copolymer, acrylonitril-ethyl methacrylate copolymer, acrylonitril-ethyl acrylate copolymer, acrylonitril-methacrylic acid copolymer, acrylonitril-acrylic acid copolymer, and acrylonitril-vinyl acetate copolymer, and further includes polyethylene oxide, ethylene oxide-propylene oxide copolymer, and polymers of acrylate or methacrylate of these compounds. Gelled compounds made by incorporating an electrolytic solution into these high-molecular materials can be used, or only the high-molecular material may be used with no change.

<Solution Process>

The term "film forming and a coating method by a solution process" in the present invention indicates a thin film forming process in which a solution, in which a material being capable of forming a thin film is dissolved into water or an organic solvent, is applied on a substrate with a constant thickness, after which the coated film is dried.

The coating method used for the above process is not limited, and includes, for example, a spin coat method, a solution casting method, a dip coat method, a blade coat method, a wire bar coat method, a gravure coat method, or a spray coat method. Further, an inkjet method, screen printing method, a letterpress method, an intaglio printing method, an offset printing method, a flexo printing method, or an inkjet method preferably reduces the number of steps, since a pattern can be formed at the same time when a film is formed by coating.

EXAMPLES

<Preparation of Flexible Transparent Substrate>

A transparent conductive film composed of indium/tin oxide (ITO) was accumulated to a thickness of 110 nm on a PEN film substrate of a size of 10 cm×10 cm having a barrier layer (sheet resistance of 13Ω/□), which was then subjected to a patterning with 5 cm in width in the central part using a general photolithographic technique and hydrochloric etching, to form a flexible transparent substrate having a transparent electrode.

<Preparation of Organic EL Element 31>

The above flexible transparent substrate was attached to a commercially available spin coater, and then, the positive hole injection layer PEDOT (PEDOT: PEDOT/PSS, manufactured by Bayer Corp., BAYTRON P AI 4083) was spin-coated on the substrate (film thickness of about 40 nm), which was then heated by a hot plate at 200° C. for one hour, to prepare a positive hole injection layer. Further, the volume of the white light emitting composite having a composition below was adjusted to make 1 ml, which was then spin-coated on the above resulting layer (film thickness of about 25 nm).

| White light emitting composite: | |
|---|---|
| Solvent: toluene | 100% by mass |
| Host material: H-A | 1% by mass |
| Blue material: Ir-A | 0.10% by mass |
| Green material: Ir(ppy)$_3$ | 0.004% by mass |
| Red material: Ir(piq)$_3$ | 0.005% by mass |

Subsequently, a coating solution for an electron transport layer was prepared as described below, which was then coated via a spin coater with conditions of 1,500 rpm and for 30 seconds, to arrange an electron transport layer. The same solution was applied on a separately prepared substrate with the same conditions, and the resulting film was determined to be 20 nm in thickness.

| (Coating Solution for Electron Transport Layer) | |
|---|---|
| 2,2,3,3-tetrafluoro-1-propanol | 100 ml |
| ET-A | 0.50 g |

The substrate, on which layers up to the electron transport layer had been arranged, was transferred to a vapor deposition apparatus without being exposed to air, and then the pressure was reduced to $4 \times 10^{-4}$ Pa. In the meantime, lithium fluoride and aluminum were charged in a resistance heating boat made of tantalum and a resistance heating boat made of tungsten respectively, which were then attached inside the vapor deposition apparatus.

First, the current was applied to the resistance heating boat made of tantalum to heat it, and thereby an electron injection layer of lithium fluoride of 0.5 nm was arranged on the substrate. Subsequently, the current was applied to the tantalum resistance heating boat made of tungsten to heat it, and thereby, a negative electrode of 100 nm in film thickness and 5 cm in width was vapor deposited at a deposit rate of 1 to 2 nm/sec. so as to be orthogonal to the above transparent conductive film.

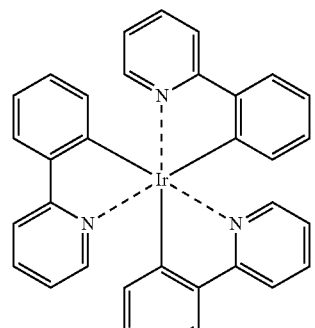

Ir(ppy)$_3$

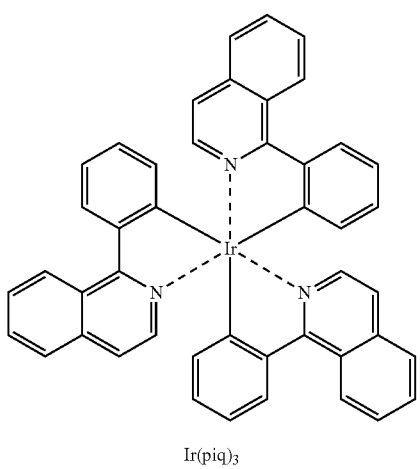

Ir(piq)$_3$

H—A

-continued

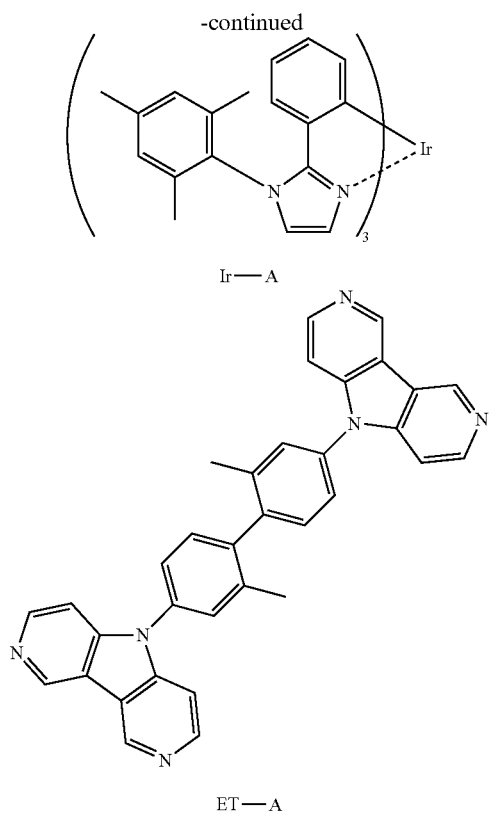

Ir—A

ET—A

Organic EL element 31 thus obtained was sealed with an aluminum foil of 30 μm in thickness using a sealant (UV RESIN XNR5570-B1, manufactured by Nagase Chemtech Co., Ltd.), after which the sealed organic EL element 31 was taken out into the atmosphere.

<Preparation of Organic Photoelectric Conversion Element 11>

Using the similar substrate to the one used for organic EL element 31, the substrate was subjected to cleaning and PEDOT layer forming processes, after which the substrate was transferred, under nitrogen gas, to a glove box which conforms to JIS 89920 and has the measured degree of cleanliness of class 10, with a dew point of lower or equal to −80° C. and oxygen density of 0.8 ppm.

In the glove box, a coating solution for a bulk hetero junction layer was prepared as described below, which solution was coated via a spin coater with conditions of 500 rpm and 60 seconds, to arrange the bulk hetero junction layer, which layer was then dried at room temperature for 30 minutes.

| (Solution for Bulk Hetero Junction Layer) | |
|---|---|
| Chlorobenzene | 1.0 g |
| PLEXCORE OS2100, manufactured by Plextronics, Inc. | 15 mg |
| PCBM, manufactured by Aldrich Co., Ltd. | 15 mg |

The substrate, on which layers up to the bulk hetero junction layer had been arranged, was transferred to a vapor deposition apparatus without being exposed to air, and then the pressure was reduced to $4 \times 10^{-4}$ Pa. In the meantime, lithium fluoride and aluminum were charged in a resistance heating boat made of tantalum and a resistance heating boat made of tungsten respectively, which were then attached inside the vapor deposition apparatus.

Next, the current was applied to the resistance heating boat made of tantalum to heat it, and thereby an electron injection layer of lithium fluoride of 0.5 nm was arranged on the substrate. Subsequently, the current was applied to the tantalum resistance heating boat made of tungsten to heat it, and thereby, a negative electrode of 100 nm in film thickness and 5 cm in width was vapor deposited at a deposit rate of 1 to 2 TIM/sec. so as to be orthogonal to the above transparent conductive film.

Organic photoelectric conversion element 11 thus obtained was sealed with an aluminum foil of 30 μm in thickness using a sealant (UV RESIN XNR5570-B1, manufactured by Nagase Chemtech Co., Ltd.), after which the sealed organic photoelectric conversion element 11 was taken out into the atmosphere.

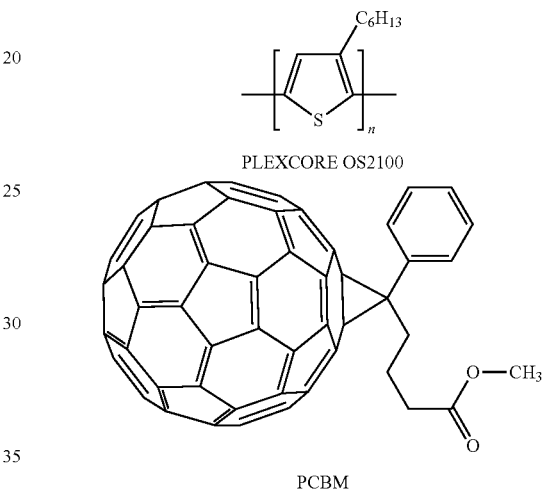

PLEXCORE OS2100

PCBM

<Preparation of Lithium-Ion Secondary Cell 21>
(Preparation of Ion Conductive Compound)

To 10 g of 3-isocyanate propyltriethoxysilane, added was 12 g of tetraethylene glycole monomethylether, and the solution was stirred for 5 hours, to prepare an ion-conductive compound.

(Preparation of Solid Electrolyte)

To 23 g of TM-300 (γ-aluminum having the primary particle size of 7 nm, manufactured by Taimei Chemicals Co., Ltd.), added were 500 g of pure water, 4.8 g of ammonia water (concentration of 28%), and then the mixed solution was stirred. The resulting solution was dispersed using the ULTRA APEX MILL (manufactured by Kotobuki Industries Co., Ltd.) at a circumferential speed of 6.8 m/sec. And then, 11.5 g of tetraethoxysilane was dropped over two hours since right after the start of the dispersion, after which the dispersion was continued. After four hours have passed from the start, the dispersion was completed, to prepare a dispersion of core particles.

To 327 g of the above core particle dispersion, added were 2,280 g of ethanol, 1,050 g of pure water, and 20 g of ammonia water (concentration of 28%) to dilute the dispersion. Further, 38 g of tetraethoxysilane was dropped at the solution temperature of 30° C. over eight hours. After that, an operation, in which the solution volume was decreased to 20% by condensation using an ultrafiltration apparatus (fractionation molecular weight of 20,000), and then, the solution volume was increased to the original one by adding acetonitrile, was repeated four times, and thereby acetonitrile substitution was carried out. Lastly, the solution volume decreased to 20% by condensation, to prepare 800 ml of dispersion of core-shell particles covered with silica.

To the above dispersion of core-shell particles covered with silica, added was 30 g of HMDS3 (manufactured by Shin-Etsu Chemical Co., Ltd.), as a silane coupling agent to restrain aggregation, which was then stirred at 60° C. for two hours. After that, using an ultrafiltration apparatus (fractionation molecular weight of 20,000), t-butanol substitution was carried out by the similar operation to the above-described one, to prepare 800 ml of dispersion. This dispersion was subjected to freeze-drying using Freeze Dryer FDU-2200 (manufactured by Tokyo Rikakikai Co., Ltd.), to prepare 25 g of white powder. Subsequently, 10 g of the white powder was put in an egg-plant flask, and then, 380 g of ethanol and 240 g of pure water were added, to prepare dispersion, and further, acetic acid was gradually dropped to the resulting dispersion to adjust pH to 4.0. To this dispersion, added was 20 g of ion conductive compound, which was prepared beforehand, which mixture was then stirred for four hours. After that, similarly to the above operation, using an ultrafiltration apparatus (fractionation molecular weight of 20,000), t-butanol substitution was carried out, to prepare 600 ml of dispersion. This dispersion was subjected to freeze-drying using Freeze Dryer FDU-2200 (manufactured by Tokyo Rikakikai Co., Ltd.), to prepare 25 g of core-shell particles composed of metal oxide particulates having ion conductive compounds on the surface thereof. To 50 g of diethylene glycol, added were 0.5 g of the above core-shell particles, which mixture was then stirred. After that, the particle size was measured using ZETASIZER 1000 HSa (manufactured by Sysmex Corp.), and as a result, the z-average particle size was 27 nm.

To 20 g of the metal oxide particulates having ion conductive compounds on the surface thereof, which were prepared in the above operation, added was 2 g of $LiBF_4$ as an alkaline metal salt, which were then mixed. The resulting mixture was degassed by decompression at 10 Pa for one hour, to prepare solid electrolytes.

(Preparation of Solid Electrolyte Film)

Each of the above prepared solid electrolytes was subjected to a pressure treatment at a temperature condition of 80 to 90° C. for 20 minutes, to prepare a solid electrolyte film of 100 μm in thickness.

(Preparation of Lithium Ion Secondary Cell 21)

To the mixture of 90% by mass of lithium-cobalt composite oxide ($LixCoO_2$) and 6% by mass of graphite powder as an ancillary conducting material, added were 4% by mass of polyvinylidene fluoride copolymer and N-methylpyrrolidone, and the resulting mixture was blended to prepare slurry.

The above slurry was applied using a wire bar to the surface of an aluminum foil (20 μm in thickness) provided with a lead wire to obtain a uniform thickness, which was then dried and pressed to prepare a positive electrode.

Next, the mixture of 96% by mass of graphite, 4% by mass of polyvinylidene fluoride copolymer, and N-methylpyrrolidone were blended to prepare slurry.

The above slurry was applied using a wire bar to the surface of a copper foil (20 μm in thickness) having a lead wire to obtain a uniform thickness, which was then dried and pressed to prepare a negative electrode.

The positive electrode, the solid electrolyte film of 100 μm in thickness, and the negative electrode, each of which had been cut out in 10 cm×10 cm, were laminated in this order to make a stack, and then ten stacks were laminated. After that, the whole stacks were stored in a package composed of a laminate film of 100 μm in thickness comprising an aluminum foil of 40 μm in thickness and polypropylene layers formed on the both surfaces of the aluminum foil, which package was then vacuum dried at 80° C. for 24 hours. In order to optimize the internal resistance, the entire surface of the above package was heated and pressed at 140° C., to make a sufficient contact between the electrodes and the solid electrolyte, and then, the package was completely sealed under vacuum using a heat sealer, to prepare lithium-ion secondary cell 21.

<Preparation of Lighting Device 1>

Organic EL element 31, organic photoelectric conversion element 11, lithium-ion secondary cell 21, and control section 40 (circuit 41), all of which were prepared in the above processes, were electrically connected to each other. After that, one of surfaces of above prepared lithium-ion secondary cell 21 and the aluminum foil sealing film side of organic EL element 31 were glued together, and the other surface of lithium-ion secondary cell 21 and the aluminum foil sealing film side of organic photoelectric conversion element 11 were glued together, to prepare sheet-shaped lighting device 1, in which organic EL element 31, lithium-ion secondary cell 21, and organic photoelectric conversion element 11 were integrated. Control section 40, into which an device which variably controls voltage is built, has functions which increases voltage from organic photoelectric conversion element 11 to a degree to be able to charge lithium-ion secondary cell 21, or controls voltage supplied from lithium-ion secondary cell 21 so that organic EL element 31 can be driven with constant current.

<Durability Test>

With regard to the thus obtained lighting device 1, there was carried out a durability test of repeating a cycle that organic photoelectric conversion element 11 was irradiated by light of 100 $mW/cm^2$ for 30 minutes, and after that, organic photoelectric conversion element 11 was put in a state of entire light shielding, and then, organic EL element 31 emits light of 1,000 $cd/m^2$ for ten minutes. After the test, the half-lives of light emission brightness of organic EL element 31, and of photoelectric conversion efficiency of organic photoelectric conversion element 11 were evaluated.

At that time, the driving was carried out using the driving patterns described in Table 1 below.

TABLE 1

| | | | Applied Voltage (Current) | | |
| --- | --- | --- | --- | --- | --- |
| | | Operating State | At OPV Power Generation | At OLED Light Emission | Periodic Switching |
| Comparative Example | Driving Pattern 1 | OPV (Organic Photovoltaics) | Forward Bias Application (0.35 V) | No Voltage Application | None |
| | | OLED (Organic EL Element) | No Voltage Application | Forward Bias Application (50 mA) | None |

TABLE 1-continued

| | | | Applied Voltage (Current) | | |
|---|---|---|---|---|---|
| | Operating State | | At OPV Power Generation | At OLED Light Emission | Periodic Switching |
| Example 1 | Driving Pattern 2 | OPV (Organic Photovoltaics) | Forward Bias Application (0.35 V) | Reverse Bias Application (−5 V) | None |
| | | OLED (Organic EL Element) | Reverse Bias Application (−5 V) | Forward Bias Application (50 mA) | None |
| Example 2 | Driving Pattern 3 | OPV (Organic Photovoltaics) | Forward Bias Application (0.35 V) | Reverse Bias Application (−5 V) | If charging potential of a secondary cell reaches 90% during power generation, electrical current is discharged to the OLED until the charging potential decreases to 80% |
| | | OLED (Organic EL Element) | Reverse Bias Application (−5 V) | Forward Bias Application (50 mA) | |
| Example 3 | Driving Pattern 4 | OPV (Organic Photovoltaics) | Forward Bias Application (0.35 V) | Reverse Bias Application (−5 V) | During power generation, a reverse bias is applied to the OPV for one millisecond per minute |
| | | OLED (Organic EL Element) | Reverse Bias Application (−5 V) | Forward Bias Application (50 mA) | During light emission, a reverse bias is applied to the OLED for one millisecond per minute |

Efficiency evaluation of organic EL element 31 and organic photoelectric conversion element 11 was carried out as follows.

<Evaluation of Organic EL Element>

Direct constant current of 50 mA (20 A/m$^2$) was applied to each organic EL element using the DC Voltage/Current Generator R6243 manufactured by ADC Corp., and front brightness at two-degree field of view was determined using a spectral radiance luminance meter CS1000, manufactured by Konica Minolta Sensing, Inc.

With a half-life of brightness of above driving pattern 1 being assumed to be 100, other driving patterns were evaluated with a relative value.

<Evaluation of Organic Photoelectric Conversion Element>

Light from a solar simulator was irradiated with an irradiation intensity of 100 mW/cm$^2$ (AM 1.5 G), and volt-ampere characteristics were measured, and then, conversion efficiency was determined.

With a half-life of brightness of above driving pattern 1 being assumed to be 100, other driving patterns were evaluated with a relative value.

Above results are given in Table 2.

TABLE 2

| | Relative Half-life of OLED Brightness | Relative Half-life of OPV Efficiency |
|---|---|---|
| Comparative Example | 100 | 100 |
| Example 1 | 143 | 134 |
| Example 2 | 140 | 151 |
| Example 3 | 157 | 155 |

From Table 2, it is found that the durability of the lighting device in combination of an organic EL element, a secondary cell, and organic photoelectric conversion element can be improved by using a driving method such as described in the present invention.

Namely, in the lighting device of Example 1, compared to Comparative Example, it was designed so that, during OPV power generation, a reverse bias was applied to the OLED, while, during OLED light emission, a reverse bias was applied to the OPV. Thereby the half-lives of both OLED and OPV were significantly increased.

Further, in the lighting device of Example 2 which is provided with a mechanism for switching the polarity of applied voltage corresponding to a charged condition of a rechargeable battery, or in the lighting device of Example 3 which is provided with a mechanism for switching the polarity of applied voltage periodically, the life of the lighting devices is further increased, and thereby the effect of the present invention can be confirmed.

DESCRIPTION OF ALPHANUMERIC DESIGNATIONS

1: a lighting device
10: a solar cell section
11: organic photoelectric conversion element
20: a secondary cell section
21: a secondary cell
30: a light-emitting section
31: an organic electroluminescence element
40: a control section
41: a connection circuit
S1 and S2: a switch

The invention claimed is:

1. A lighting device comprising:
an organic photoelectric conversion element; an organic electroluminescence element;
a secondary cell;
an electrical connection which connects the organic photoelectric conversion element, the organic electroluminescence element, and the secondary cell to each other; and
a control section which controls the electrical connection, wherein the control section controls the electrical connection so that, when the organic photoelectric conversion element receives an outer light to generate electricity and charges the secondary cell, a reverse bias voltage is applied to the organic electroluminescence element, and, when the organic electroluminescence element is supplied with electric power from the secondary cell to emits light, a reverse bias voltage is applied to the organic photoelectric conversion element,
wherein the control section switches, on charging the secondary cell, the connection of the secondary cell from the organic photoelectric conversion element to the organic electroluminescence element when charging voltage of the secondary cell becomes higher than or equal to overcharge protection voltage, and
wherein, when the charging voltage of the secondary cell reaches the overcharge protection voltage, electrical current is discharged to the organic electroluminescence element until the charging voltage decreases to a predetermined voltage which is lower than the overcharge protection voltage.

2. The lighting device described in claim 1, wherein the reverse bias voltage applied to the organic electro luminescence element is −0.5 to −30 V.

3. The lighting device described in claim 2, wherein the reverse bias voltage applied to the organic electroluminescence element is −5 to −15 V.

4. The lighting device described in claim 1, wherein the reverse bias voltage applied to the organic photoelectric conversion element is −0.5 to −30 V.

5. The lighting device described in claim 4, wherein the reverse bias voltage applied to the organic photoelectric conversion element is −5 to −15 V.

6. The lighting device described in claim 1, wherein the control section applies a reverse bias voltage on a temporary basis at every constant time interval to both the organic photoelectric conversion element at the time of a charging and the organic electroluminescence element at the time of the light emission.

7. The lighting device described in claim 6, wherein the duty rate of ON time to OFF time is 10:1 to 1,000,000:1.

8. The lighting device described in claim 1, wherein the organic electroluminescence element is a phosphorescent light emitting device.

9. The lighting device described in claim 1, wherein both the organic electroluminescence element and the organic photoelectric conversion element are formed by a solution process, in which a coating solution which is a liquid composite is applied to a substrate via a coating means to form a coated film layer.

10. The lighting device described in claim 1, wherein the organic electroluminescence element, the organic photoelectric conversion element, and the secondary cell are formed on a flexible board in sheet shape and are laminated.

11. The lighting device described in claim 1, wherein when the reverse bias voltage to the organic photoelectric conversion element is applied, the reverse bias voltage to the organic electroluminescence element is not applied.

* * * * *